(12) United States Patent
Bierbrauer et al.

(10) Patent No.: US 11,414,226 B2
(45) Date of Patent: Aug. 16, 2022

(54) REMOVABLE TABS AND METHODS OF MAKING AND USING THE SAME

(71) Applicant: Hutchinson Technology Incorporated, Hutchinson, MN (US)

(72) Inventors: Erich W. Bierbrauer, Hutchinson, MN (US); Scott J. Cray, Winsted, MN (US); Peter F. Ladwig, Hutchinson, MN (US); Clark T. Olsen, Dassel, MN (US); Zachary A. Pokornowski, Cokato, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 16/282,257

(22) Filed: Feb. 21, 2019

(65) Prior Publication Data
US 2019/0263550 A1    Aug. 29, 2019

Related U.S. Application Data

(60) Provisional application No. 62/634,739, filed on Feb. 23, 2018.

(51) Int. Cl.
*H05K 1/14*    (2006.01)
*B65B 15/04*    (2006.01)
(Continued)

(52) U.S. Cl.
CPC .......... *B65B 15/04* (2013.01); *B29C 63/0013* (2013.01); *H01L 21/00* (2013.01);
(Continued)

(58) Field of Classification Search
CPC ... H05K 2203/0147; H05K 2203/0152; H05K 2203/0156; H05K 13/00; H05K 13/0015; H05K 13/0061; H05K 13/0069; Y10T 428/19; Y10T 428/192; Y10T 428/195; Y10T 428/14; Y10T 428/1414; Y10T 428/1438; Y10T 428/1443; Y10T 428/1452; Y10T 428/1462; Y10T 428/1471; Y10T 428/1476; Y10T 428/149; Y10T 428/1495; Y10T 428/28; Y10T 428/2804; Y10T 428/2839; Y10T 428/2848; Y10T 428/2852; Y10T 428/287;
(Continued)

(56) References Cited

U.S. PATENT DOCUMENTS 5,783,370 A    7/1998    Groom et al.
5,884,773 A    3/1999    Rudi
(Continued)

OTHER PUBLICATIONS

International Search Report and Written Opinion in International Application No. PCT/US2019/019169, dated Jun. 13, 2019.
(Continued)

*Primary Examiner* — Maria V Ewald
*Assistant Examiner* — Ethan A. Utt
(74) *Attorney, Agent, or Firm* — DLA Piper LLP (US)

(57) ABSTRACT

A method of making a component includes applying a clamping force to the component, the component coupled to a carrier strip of a panel via a polymeric tab and separating a portion of the polymeric tab from a substrate of the component, thereby causing the component to be detached from the panel.

14 Claims, 9 Drawing Sheets

(51) Int. Cl.
  *H05K 3/00* (2006.01)
  *H05K 13/00* (2006.01)
  *B29C 63/00* (2006.01)
  *H01L 21/00* (2006.01)

(52) U.S. Cl.
  CPC ............... *H05K 1/14* (2013.01); *H05K 3/007* (2013.01); *H05K 3/0026* (2013.01); *H05K 13/0061* (2013.01); *H05K 13/0084* (2013.01); *H05K 2203/0156* (2013.01); *H05K 2203/068* (2013.01)

(58) Field of Classification Search
  CPC ......... Y10T 428/2878; Y10T 428/2887; Y10T 428/2891; Y10T 428/24355; Y10T 428/31; Y10T 428/31511; Y10T 428/31515; Y10T 428/31518; Y10T 428/31522; Y10T 428/31525; Y10T 428/31529; Y10T 428/31721; Y10T 428/31855; Y10T 428/31909; Y10T 428/31928; Y10T 428/31935; Y10T 428/31678; Y10T 428/31681; Y10T 428/31692; Y10T 428/31699; B32B 7/00; B32B 7/04; B32B 7/05; B32B 7/06; B32B 7/12; B32B 7/14; B32B 15/00; B32B 15/04; B32B 15/043; B32B 15/08; B32B 15/082; B32B 15/092; B32B 15/18; B32B 15/20; B32B 27/00; B32B 27/04; B32B 27/06; B32B 27/08; B32B 27/28; B32B 27/281; B32B 27/30; B32B 27/308; B32B 27/38; B32B 33/00; B32B 2307/748; C09J 7/00; C09J 7/20; C09J 7/201; C09J 7/203; C09J 7/22; C09J 7/24; C09J 7/25; C09J 7/28; C09J 7/29; C09J 7/30; C09J 7/40; C09J 7/403; C09J 9/00; C09J 2203/318; C09J 2203/322; C09J 2203/326; C09J 2301/10; C09J 2301/16; C09J 2301/162; C09J 2301/18; C09J 2301/20; C09J 2301/21; C09J 2301/50; C09J 2301/502; C09J 2433/00; C09J 2433/006; C09J 2463/00; C09J 2463/006; C09J 2479/00; C09J 2479/08; C09J 2479/068; H01L 21/683; H01L 21/6835
  USPC ......... 428/57, 58, 60, 40.1, 40.4, 40.9, 41.1, 428/41.3, 41.5, 41.7, 41.8, 42.2, 42.3, 428/343, 344, 352, 354, 355 R, 355 EP, 428/355 EN, 355 CN, 355 AC, 141, 409, 428/413–418, 473.5, 500, 515, 520, 522, 428/457, 458, 461, 463
  See application file for complete search history.

(56) References Cited

U.S. PATENT DOCUMENTS

| | | | |
|---|---|---|---|
| 7,549,211 B1* | 6/2009 | Keranen | G11B 5/484 205/119 |
| 7,774,922 B1* | 8/2010 | Kiviahde | G11B 5/4833 29/603.03 |
| 8,146,233 B1 | 4/2012 | Kariniemi et al. | |
| 8,634,164 B1 | 1/2014 | Scheele et al. | |
| 2014/0063769 A1* | 3/2014 | Wittenberg | H05K 3/341 361/785 |
| 2014/0206245 A1 | 7/2014 | Sato | |
| 2017/0007619 A1 | 3/2017 | Seipel et al. | |

OTHER PUBLICATIONS

International Preliminary Report on Patentability in International Application No. PCT/US2019/019169, dated Sep. 3, 2020.

* cited by examiner

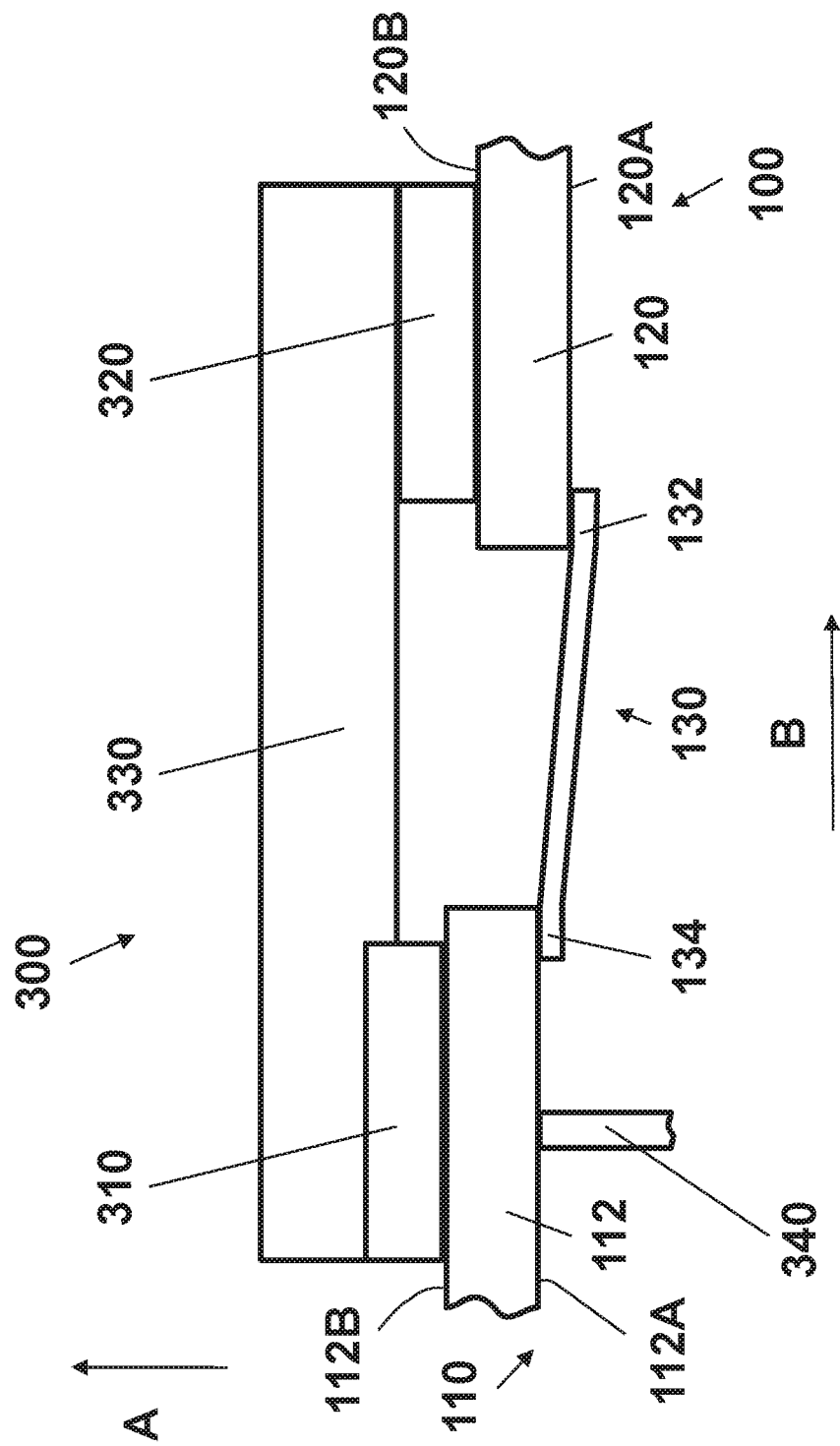

US 11,414,226 B2

REMOVABLE TABS AND METHODS OF MAKING AND USING THE SAME

CROSS-REFERENCE TO RELATED APPLICATIONS

This application claims the benefit of U.S. Provisional Application No. 62/634,739 filed on Feb. 23, 2018, which is hereby incorporated by reference in its entirety.

TECHNICAL FIELD

The present disclosure relates generally to removable tabs. More specifically, the present disclosure relates to removable tabs for coupling a component to a carrier strip of a panel during manufacturing of the component.

BACKGROUND

In many applications, a plurality of components (e.g., electronic micro-components) are formed simultaneously in a panel using a plurality of forming processes (e.g., etching, plating, etc.) To secure the components within the panel during the forming processes, each of the plurality of components are coupled to a carrier strip of the panel using one or more removable tabs. Often, removal of these removable tabs requires etching, cutting, or fracturing of the removable tabs. Further, the number and design of these removable tabs can reduce the number of components that can be formed in a given panel. The present disclosure is directed to solving these and other problems.

SUMMARY

According to some embodiments of the present disclosure, a method of making a component includes applying a clamping force to the component, the component being coupled to a carrier strip of a panel via a polymeric tab, and separating a portion of the polymeric tab from a substrate of the component, thereby causing the component to be detached from the panel.

According to some embodiments of the present disclosure, a method for detaching a component from a carrier strip includes applying a first clamping force to the component, applying a second clamping force to the carrier strip to aid in inhibiting movement of the carrier strip relative to the component, and applying a peel force to a polymeric tab having a first portion coupled to the carrier strip and a second portion coupled to a substrate of the component, thereby separating at least a portion of the second portion of the polymeric tab from the substrate of the component.

According to some embodiments of the present disclosure, detaching a component from a carrier strip of a panel includes placing the panel on a sheet, laser cutting the panel, and separating a portion of a polymeric tab from a substrate of the component, thereby causing the component to be detached from the panel.

According to some embodiments of the present disclosure, a polymeric tab comprises a first portion coupled to a carrier strip of a panel, and a second portion coupled to a substrate of a component, the second portion configured to separate from the substrate of the component responsive to application of a peeling force.

According to some embodiments of the present disclosure, a panel comprises a plurality of components, a plurality of carrier strips for supporting the components, and a plurality of a polymeric tabs, each of the plurality of polymeric tabs having a first portion coupled to one of the plurality of carrier strips and a second portion coupled to a substrate of a corresponding one of the plurality of components, each of the plurality of polymeric tabs configured to separate from the substrate of the one of the plurality of components responsive to application of a peeling force.

The above summary is not intended to represent each embodiment or every aspect of the present invention. Additional features and benefits of embodiments of the present invention are apparent from the detailed description and figures set forth below.

BRIEF DESCRIPTION OF THE DRAWINGS

FIG. 3B is a side view of the panel and the tab removal device of FIG. 3A with a peeling force applied to a polymeric tab according to some embodiments of the present disclosure;

Figure 1:
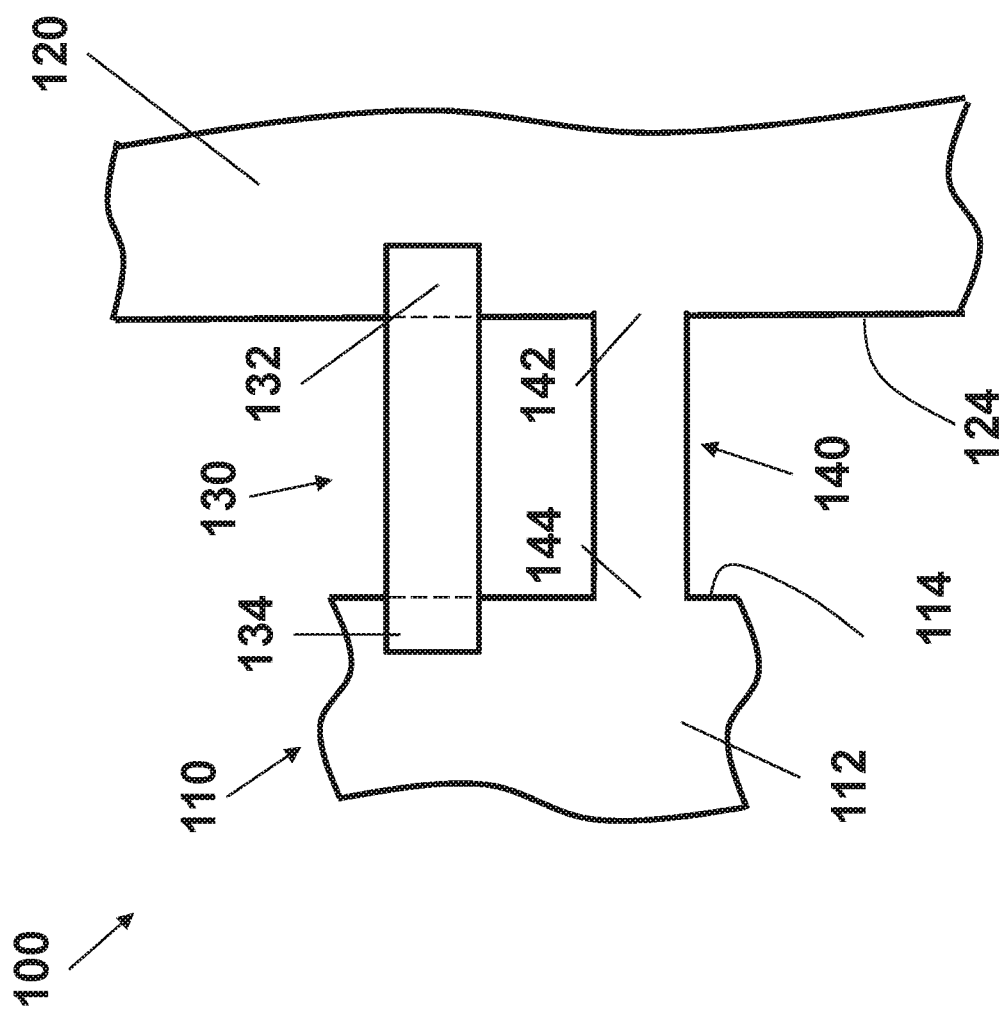
FIG. 1 is a plan view of a panel including a polymeric tab according to some embodiments of the present disclosure.

While embodiments of the invention are susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Figure 2:
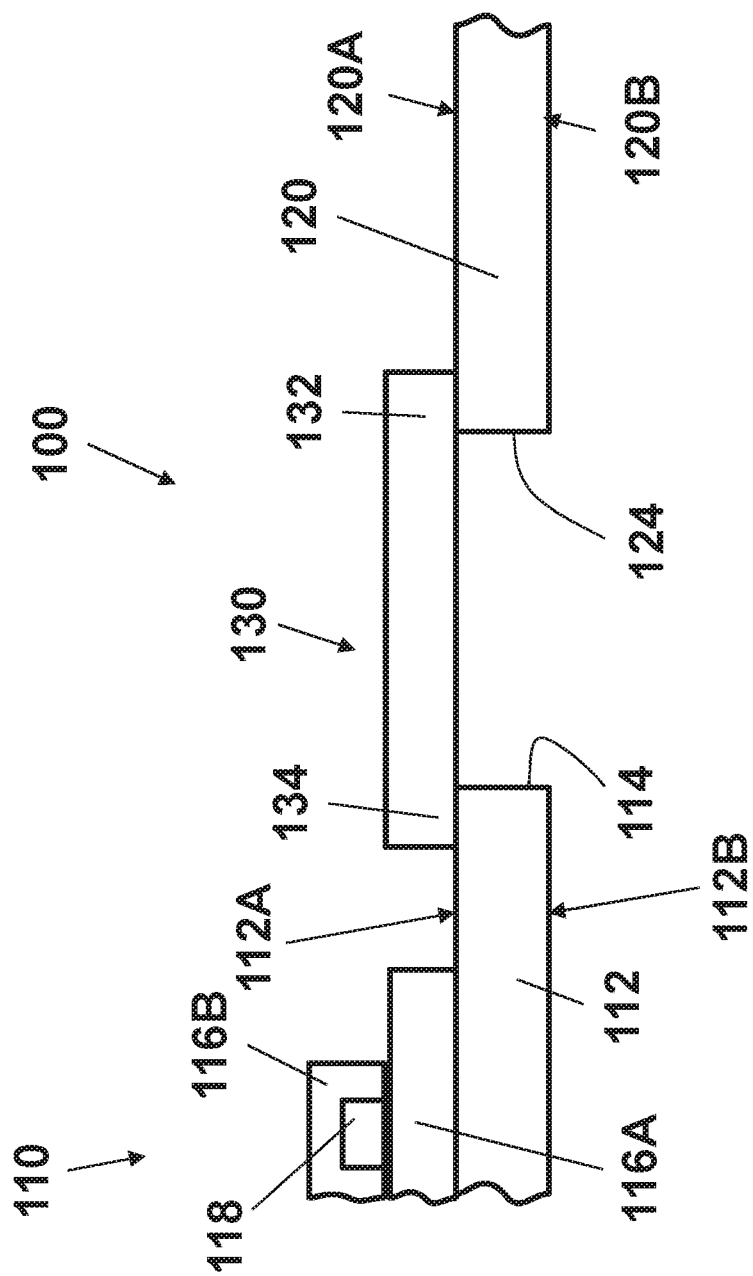
FIG. 2 is a partial side view of the panel of FIG. 1 according to some embodiments of the present disclosure.

Referring generally to FIGS. 1 and 2, a panel 100 includes a component 110, a carrier strip 120, a polymeric tab 130, and an optional metal tab 140. Generally, the panel 100 is used to form a plurality (e.g., ten, twenty, fifty, one-hundred, five hundred etc.) of components (e.g., component 110) and includes a plurality of carrier strips (e.g., carrier strip 120) to support the components in the panel 100. A plurality of polymeric tabs (e.g., polymeric tab 130) and/or a plurality of metal tabs (e.g., metal tab 140) couple the plurality of components (e.g., component 110) to the plurality of carrier strips (e.g., carrier strip 120) to secure the plurality of components to the panel during one or more processing steps used to form the plurality of components (e.g., etching, plating, etc.) Embodiments of polymeric tabs, such as those described herein, enable one or more polymeric tabs to connect to a component which can be used as a hinge point because of the flexibility of the polymeric tab and allows the part to hinge instead of bending a formed area of a component, such as a stainless steel product, which is beneficial for reducing part damage.

Generally, the component 110 is a component for use in an electronic device, such as, for example, a printed circuit board (PCB), a micro-interconnect, a microcircuit, a hard disk drive suspension component, a hard disk drive flexure, a sensor, a medical device component, an actuator, a light emitting diode ("LED"), a processor, micro-electromechanical system ("MEMS"), or the like. The component 110 includes a substrate 112. The substrate 112 can be made from, for example, a metal (e.g., stainless steel), a polymer (e.g., polyimide), ceramic, or any combination thereof. As shown in FIG. 2, according to some embodiments, the component 110 includes a first insulating layer 116A, a conductive layer 118, and a second insulating layer 116B. The first insulating layer 116A electrically isolates the conductive layer 118 from the substrate 112, and the second insulating layer 116B covers at least a portion of the conductive layer 118.

The carrier strip 120 has an upper surface 120A and a lower surface 120B (FIG. 2). As described above, the carrier strip 120 is generally used to support the component 110 during one or more processing steps (e.g., etching, plating, etc.) during the manufacturing of the component 110. The carrier strip 120 can be made from, for example, metal (e.g., stainless steel), a polymer (e.g., polyimide), or any other material.

As best shown in FIG. 2, an edge 124 of the carrier strip 120 is spaced from an edge 114 of the substrate 112 of the component 110, defining a gap between the carrier strip 120 and the component 110 in the panel 100. According to some embodiments, the edge 124 of the carrier strip 120 is spaced from the edge 114 of the substrate 112 of the component 110 by a distance that is between about 5 microns and about 300 microns, between about 50 microns and about 200 microns, or between about 50 microns and about 100 microns.

The polymeric tab 130 is used to couple the component 110 to the carrier strip 120 and includes a first portion 132 and a second portion 134. As shown, the first portion 132 is coupled to the upper surface 120A (FIG. 2) of the carrier strip 120. Similarly, the second portion 134 is coupled to an upper surface 112A (FIG. 2) of the substrate 112 of the component 110. In this manner, the polymeric tab 130 couples the component 110 to the carrier strip 120 (FIGS. 1 and 2). The polymeric tab 130 can be made from a dielectric material such as, for example, polyimide, epoxy, acrylic, or any combination thereof. According to some embodiments, the polymeric tab 130 includes a metalized layer (e.g., copper, nickel, gold, platinum, aluminum, chromium, etc.) formed on an upper surface of the polymeric tab 130, a lower surface of polymeric tab 130, or both. The polymeric tab 130 has a generally rectangular shape (FIG. 1), although other shapes are possible (e.g., a circular shape, a triangular shape, a polygonal shape, etc.)

As shown, the second portion 134 of the polymeric tab 130 extends a first distance from the edge 114 of the substrate 112 onto the upper surface 112A (FIG. 2) of the polymeric tab 130. According to some embodiments, the first distance can be between about 1 micron and about 500 microns, between about 3 microns and about 300 microns, between about 5 microns and about 200 microns, etc. For some embodiments, the first distance is about 75 microns. Further, according to some embodiments, the first distance is proportional to a thickness of the polymeric tab 130 (e.g., the first distance is between about 2 times to about 20 times greater than the thickness of the polymeric tab 130, the first distance is about 5 times greater to about 10 times greater than the thickness of the polymeric tab 130, etc.) For various embodiments, the first distance is about 7.5 times the thickness of the polymeric tab 130 (e.g., the first distance is about 75 microns and the thickness of the polymeric tab 130 is about 10 microns). The first portion 132 of the polymeric tab 130 extends a second distance from the edge 124 of the carrier strip 120 onto the upper surface 120A (FIG. 2) of the carrier strip 120. The second distance can be within any of the ranges described above for the first distance and more generally the second distance can be the same as the first distance or different than the first distance.

While the first portion 132 of the polymeric tab 130 is shown as being coupled to the upper surface 112A of the substrate 112 and the second portion 134 is shown as being coupled to the upper surface 112A (FIG. 2) of the carrier strip 120, according to some embodiments, the polymeric tab 130 can be coupled to the lower surface 112B of the substrate 112 and/or the lower surface 120B of the carrier strip 120. While the second portion 134 of the polymeric tab 130 has been described and shown herein as being coupled to the substrate 112 of the component 110, according to some embodiments, the second portion 134 of the polymeric tab 130 can be coupled to the first insulating layer 116A, the conductive layer 118, and/or the second insulating layer 116B.

Referring to FIG. 1, the optional metal tab 140 is similar to the polymeric tab 130 in that the optional metal tab 140 is generally used to couple the component 110 to the carrier strip 120. More specifically, a first portion 142 of the optional metal tab 140 is coupled to the upper surface 120A (FIG. 2) of the carrier strip 120 and a second portion 144 of the optional metal tab 140 is coupled to the upper surface 112A (FIG. 2) of the substrate 112 of the component 110. The optional metal tab 140 differs from the polymeric tab 130 in that the optional metal tab 140 is made from a metal material, such as, for example, stainless steel or copper. The optional metal tab 140 also differs from the polymeric tab 130 in that the optional metal tab 140, the substrate 112 of the component 110, and the carrier strip 120 are unitary and/or monolithic. According to some embodiments, the optional metal tab 140 can be thinner than the substrate 112 of the component 110 to aid in removing the optional metal tab 140 from the substrate 112 as described in further detail below.

The optional metal tab 140 can be used to support the component 110 during one or more etching processes during manufacture of the component 110 in the panel 100. This is advantageous because the polymeric strip 130 may not possess sufficient structural strength to keep the component 110 coupled to the carrier strip 120 during the etching processes without failing (e.g., delaminating and/or fracturing). The optional metal tab 140 can be separated from the component 110 as part of the etching process, or after completion of the etching processes, by using a laser, or by shearing and/or bending the carrier strip 120 in a forming die, for example. In contrast, according to some embodiments, the polymeric tab 130 remains in the panel 100 until all of the processing steps required to produce the finished component 110, and then the polymeric tab 130 is removed using the method described in detail below, for example.

While the panel 100 in FIG. 1 is shown as including one component, one carrier strip, one polymeric tab, and one optional metal tab, the panel 100 can more generally include a plurality of polymeric tabs (e.g., two polymeric tabs, four polymeric tabs, six polymeric tabs, eight polymeric tabs, ten polymeric tabs, etc.), such as embodiments of the polymeric tabs described herein, that are coupled to any one of any number of sides (e.g., two sides, four sides, six sides, eighth sides, ten sides, etc.) of any number of components, for example, those that are the same as or similar to the component 110, to couple the components to any number of carrier strips, for example those that are the same as or similar to the carrier strip 120. Likewise, the panel 100 can include a plurality of metal tabs (e.g., two metal tabs, four metal tabs, six metal tabs, eight metal tabs, ten metal tabs, etc.), for example, those that are the same as or similar to the optional metal tab 140 that are coupled to any one of any number of sides (e.g., two sides, four sides, six sides, eighth sides, ten sides, etc.) of any number of components, for example, those that are the same as or similar to the component 110, to couple the components to any number of carrier strips, for example, those that are the same as or similar to the carrier strip 120. Further, each component in the panel 100 can be coupled to one or more carrier strips using the same or different number of polymeric tabs and metal tabs (e.g., two polymeric tabs and one metal tab, two polymeric tabs and two metal tabs, one polymeric tab and three metal tabs, etc.).

Figure 3A:
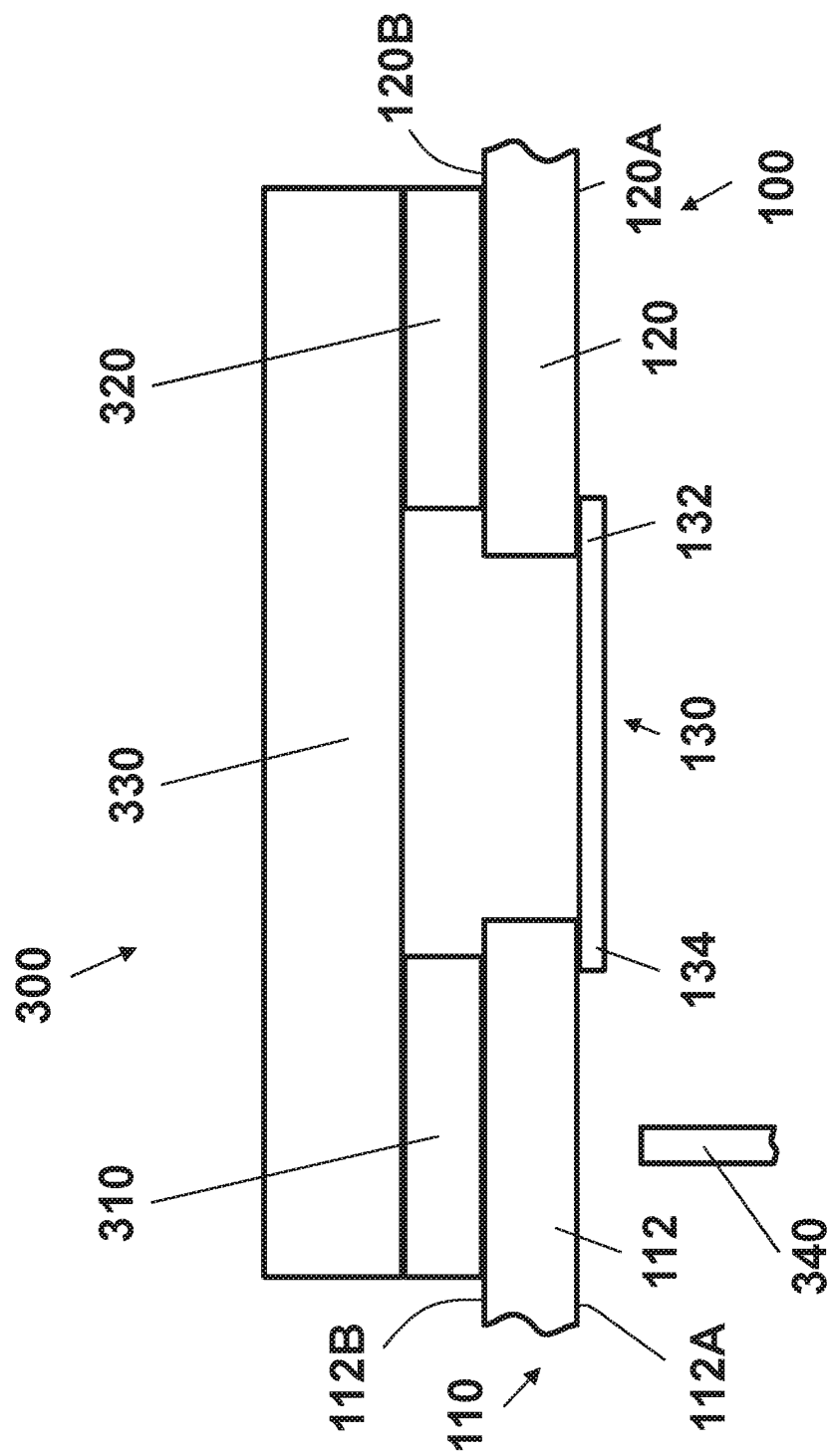
FIG. 3A is a side view of the panel and a tab removal device according to some embodiments of the present disclosure.
Figure 3C:
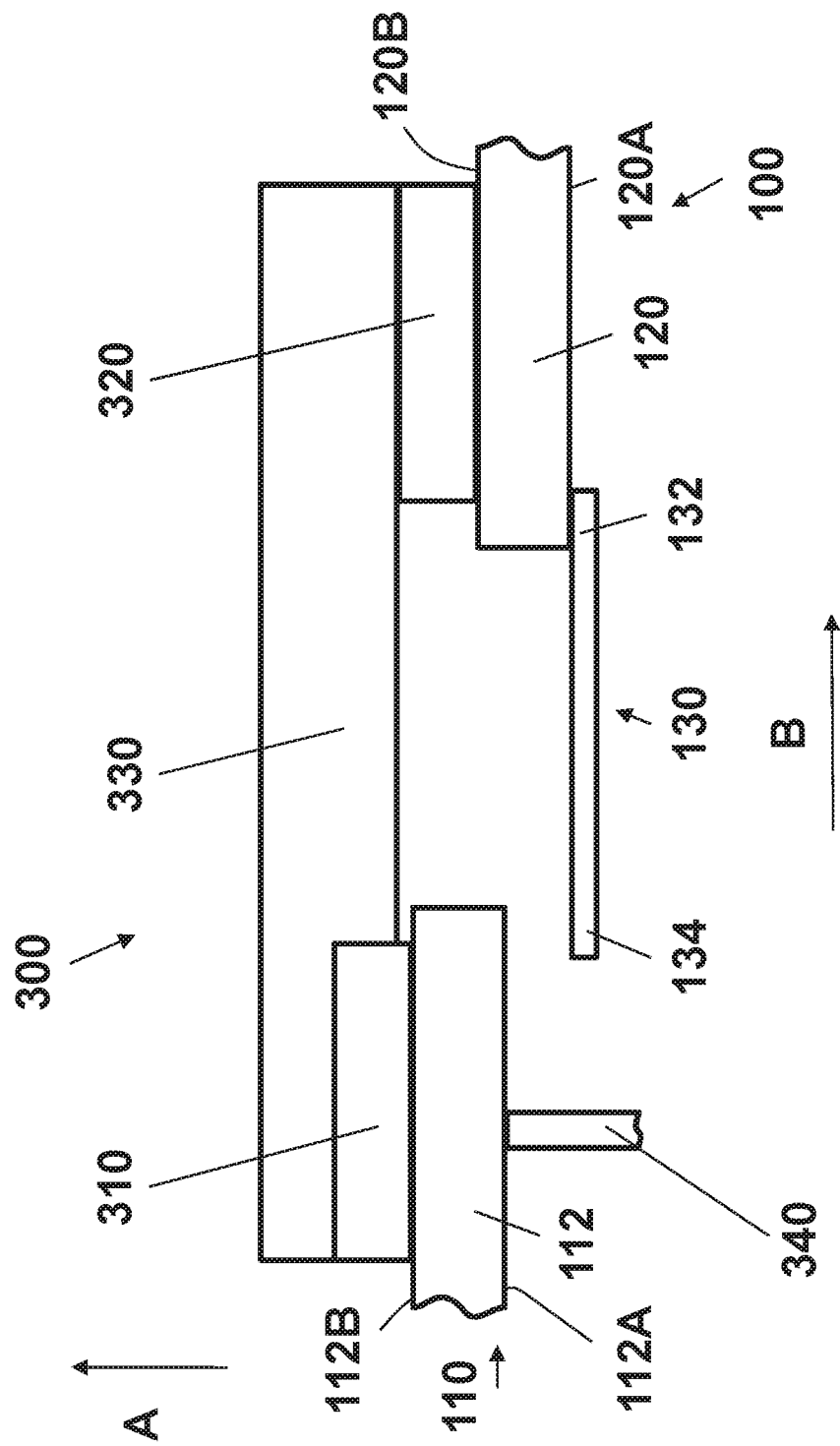
FIG. 3C is a side view of the panel and the tab removal device of FIG. 3B with the polymeric tab detached from a component of the panel according to some embodiments of the present disclosure.

A method for detaching the component 110 from the carrier strip 120 by separating the polymeric tab 130 from the substrate 112 of the component 110 is described in reference to FIGS. 3A-3C. A removal device 300 for separating the polymeric tab 130 from the substrate 112 of the component 110 includes a first spring clamp 310, a second spring clamp 320, a vacuum head 330, and an ejector pin 340. Generally, the tab removal device 300 is used to linearly move the component 110 in the direction of arrow A (FIGS. 3B and 3C) to apply a peeling force to the polymeric tab 130.

The first spring clamp 310 of the tab removal device 300 is positioned directly adjacent to the lower surface 112B of the substrate 112 of the component 110 and secures the component 110 to the tab removal device 300. Similarly, the second spring clamp 320 of the tab removal device 300 is positioned directly adjacent to the lower surface 120B of the carrier strip 120 and secures the carrier strip 120 to the tab removal device 300. As shown in FIG. 3A, in an initial loading position, the first spring clamp 310 and the second spring clamp 320 are positioned at the same height relative to the vacuum head 330 such that the panel 100 is generally horizontal and the component 110 is positioned at the same height as the carrier strip 120.

Referring to FIG. 3B, in order to separate the second portion 134 of the polymeric tab 130 from the substrate 112 of the component 110, the ejector pin 340 linearly moves in the direction of arrow A and contacts the upper surface 112A of the substrate 112. Linear movement with the ejector pin 340 contacting the substrate 112 causes a corresponding linear movement of the component 110 and the first spring clamp 310 in the direction of arrow A, as shown by a comparison between FIG. 3A and FIG. 3B. As the first spring clamp 310 moves in the direction of arrow A, a spring (not shown) compresses and generally urges the first spring clamp 310 and the component 110 in the opposite direction of arrow A. The second spring clamp 320 inhibits movement of the carrier strip 120 relative to the component 110 such that as the component 110 moves in the direction of arrow A, while the carrier strip 120 remains clamped in place, a peeling force (e.g., a tensile force and a shear force) is applied to the polymeric tab 130 generally in the direction of arrow B. The peeling force urges the second portion 134 of the polymeric tab 130 to delaminate from the upper surface 112A of the substrate 112 (FIG. 3C).

As linear movement of the ejector pin 340 continues to cause linear movement of the component 110 in the direction of arrow A, the peeling force applied to the polymeric tab 130 increases until the peeling force is sufficient to cause the second portion 134 of the polymeric tab 130 to separate from (e.g., delaminate from) the upper surface 112A of the substrate 112 of the component 110. The required peeling force corresponds to the distance between the edge 124 of the carrier strip 120 and the edge 114 of the substrate 112 of the component 110. More specifically, a greater distance between edge 124 of the carrier strip 120 from an edge 114 of the substrate 112 of the component 110 requires a greater peeling force. For example, reducing the distance from about 200 microns to about 100 microns reduces the required peeling force.

Advantageously, the force that the tab removal device 300 is required to impart in order to separate (e.g., delaminate) the polymeric tab 130 from the upper surface 120A of the substrate 120 is less than the force required to separate (e.g., fracture) the optional metal tab 140 from the component 110. For example, the force that the tab removal device 300 is required to impart can be 75% of the force required to separate (e.g., fracture) the optional metal tab 140 from the component 110, 60% of the force required to separate (e.g., fracture) the optional metal tab 140 from the component 110, 45% of the force required to separate (e.g., fracture) the optional metal tab 140 from the component 110, 30% of the force required to separate (e.g., fracture) the optional metal tab 140 from the component 110, 15% of the force required to separate (e.g., fracture) the optional metal tab 140 from the component 110, etc. A reduction in the force required to separate (e.g., delaminate) the polymeric tab 130 from the upper surface 120A of the substrate 112 of the component 110 can also permit an increase in the density (e.g., number) of components in the panel 100.

According to some embodiments, the separating of the second portion 134 from the substrate 112 of the component 110 (e.g., using the method described above in reference to FIGS. 3A-3C or a different method such as fracturing) includes laser ablation, mechanical shear, laser-assisted delamination, temperature-assisted delamination, chemical-assisted delamination, light-assisted delamination, ultrasonic-assisted delamination, or any combination thereof.

According to some embodiments, the upper surface 112A (FIG. 2) of the substrate 112 includes a treated surface to aid in the separating the second portion 134 from the substrate 112 (e.g., during the method described above in reference to FIGS. 3A-3C). For example, the treated surface can be a chemically roughened surface, a mechanically roughened surface, a mechanically polished surface, an oxidized surface, a laser polished surface, a coating, or any combination thereof. In other examples, the substrate 112 includes a surface layer formed on the upper surface 112a of the substrate 112 using a thin film deposition plating method, a coating method, or an electrostatic method. Further, in some examples, the treated surface provides a desired surface energy of the substrate 112.

Figure 4B:
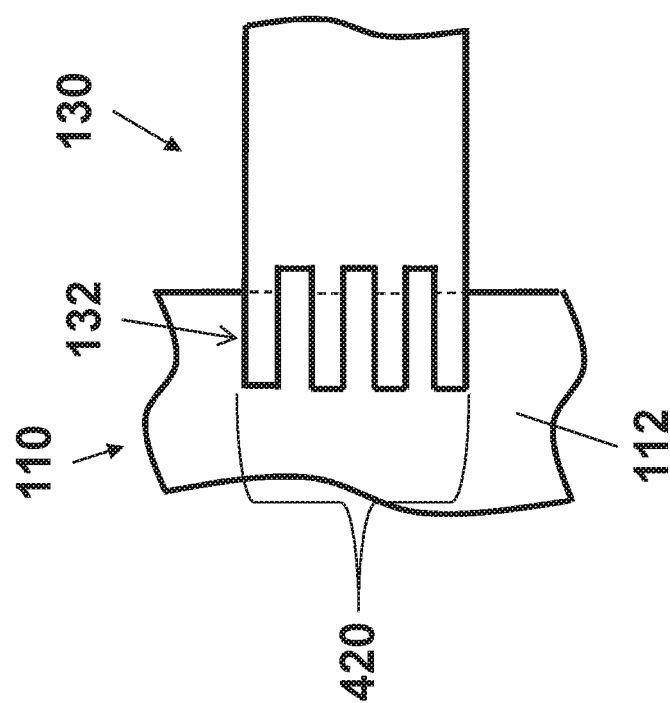
FIG. 4B is a partial plan view of the polymeric tab of FIG. 1 including a plurality of fingers according to some embodiments of the present disclosure.
Figure 4A:
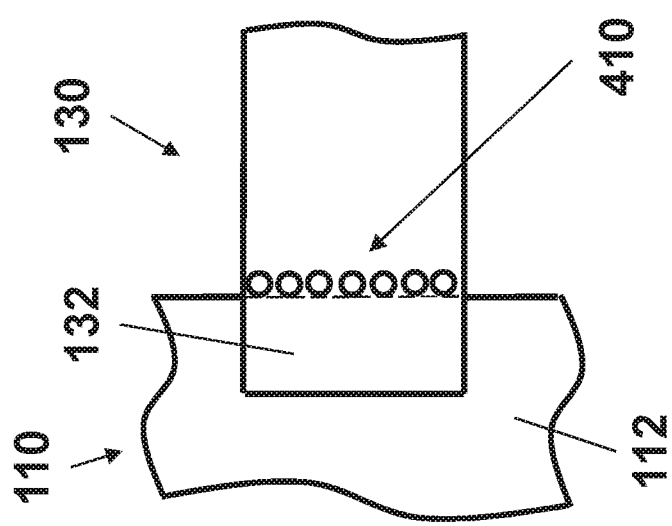
FIG. 4A is a partial plan view of the polymeric tab of FIG. 1 including a plurality of perforations according to some embodiments of the present disclosure.

Referring to FIG. 4A, according to some embodiments, the polymeric tab 130 includes an optional plurality of perforations 410 extending along a width of the polymeric tab 130 adjacent to the second portion 134. The optional plurality of perforations 410 aid in separating (e.g., delaminating or fracturing) the polymeric tab 130 from the substrate 112 of the component 110 by acting as a line of weakness. While the plurality of perforations 410 are shown as being directly positioned along a line directly adjacent to the second portion 134, the plurality of perforations 410 can more generally be located anywhere on the polymeric tab 130 (e.g., on the second portion 134, on the first portion 132, between the first portion 132 and the second portion 134, or any combination thereof).

Referring to FIG. 4B, according to some embodiments, the second portion 134 of the polymeric tab 130 includes a plurality of fingers 420 that extend from an edge of the polymeric tab 130 and onto the upper surface 112A (FIG. 2) of the substrate 112 of the component 110. The plurality of fingers 420 aid in the separating (e.g., delaminating) of the second portion 134 from the substrate 112 of the component 110. While the plurality of fingers 420 is shown as including five fingers in FIG. 4B, any number of fingers is possible (e.g., two fingers, three fingers, six fingers, ten fingers, twenty fingers, etc.) Further, while each of the plurality of fingers 420 is shown as having a rectangular shape, other shapes and sizes are possible.

Figure 5:
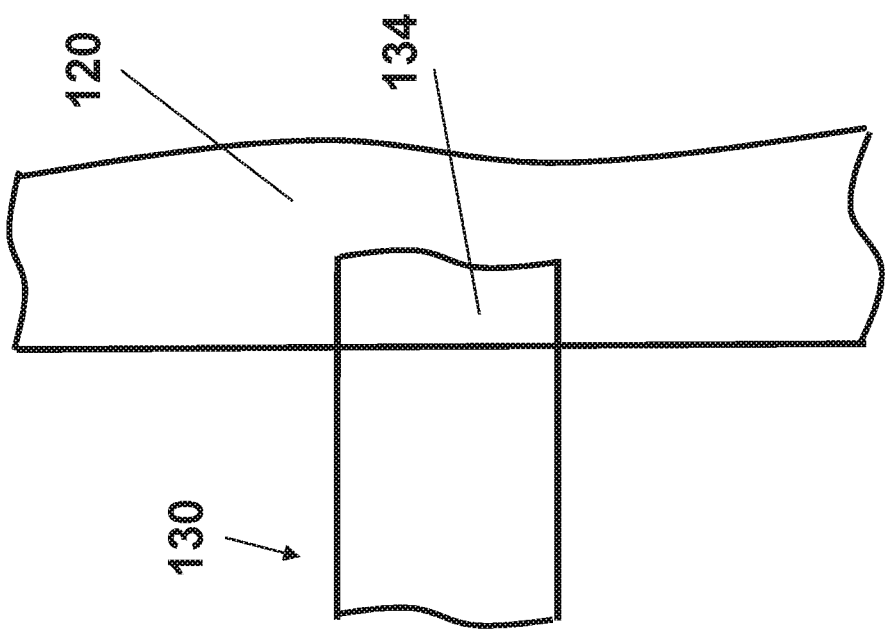
FIG. 5 is a partial plan view of the panel of FIG. 1 with the polymeric tab fractured according to some embodiments of the present disclosure.
Figure 5:
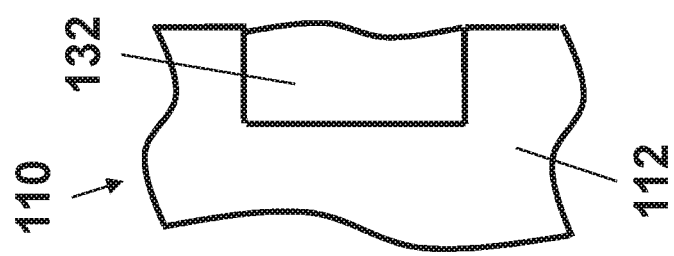

Referring to FIG. 5, according to some embodiments, rather than delaminating the second portion 134 of the polymeric tab 130 from the substrate 112, the polymeric tab 130 can fractured to separate the component 110 from the carrier strip 120. The polymeric tab 130 can be fractured by, for example, applying a fracture force to the polymeric tab 130 and/or twisting the polymeric tab 130 relative to the component 110 and/or the carrier strip 120. In this alternative method, the second portion 134 of the polymeric tab 130 separates from the rest of the polymeric tab 130 and remains coupled to the substrate 112 of the component 110 as shown in FIG. 5. Advantageously, in this configuration, when the substrate 112 is a conductive material (e.g., stainless steel), the second portion 134 remaining on the substrate 112 directly adjacent to the edge 114 (FIG. 1) electrically insulates the conductive substrate 112 and inhibits electrical contact with another component, which could cause a short circuit. Further, permanently leaving the second portion 134 of the polymeric tab 130 can be advantageous as the remaining second portion 134 can regulate relative motion between layers of a product including the component 110 (e.g., reduce stiffness).

Figure 6:
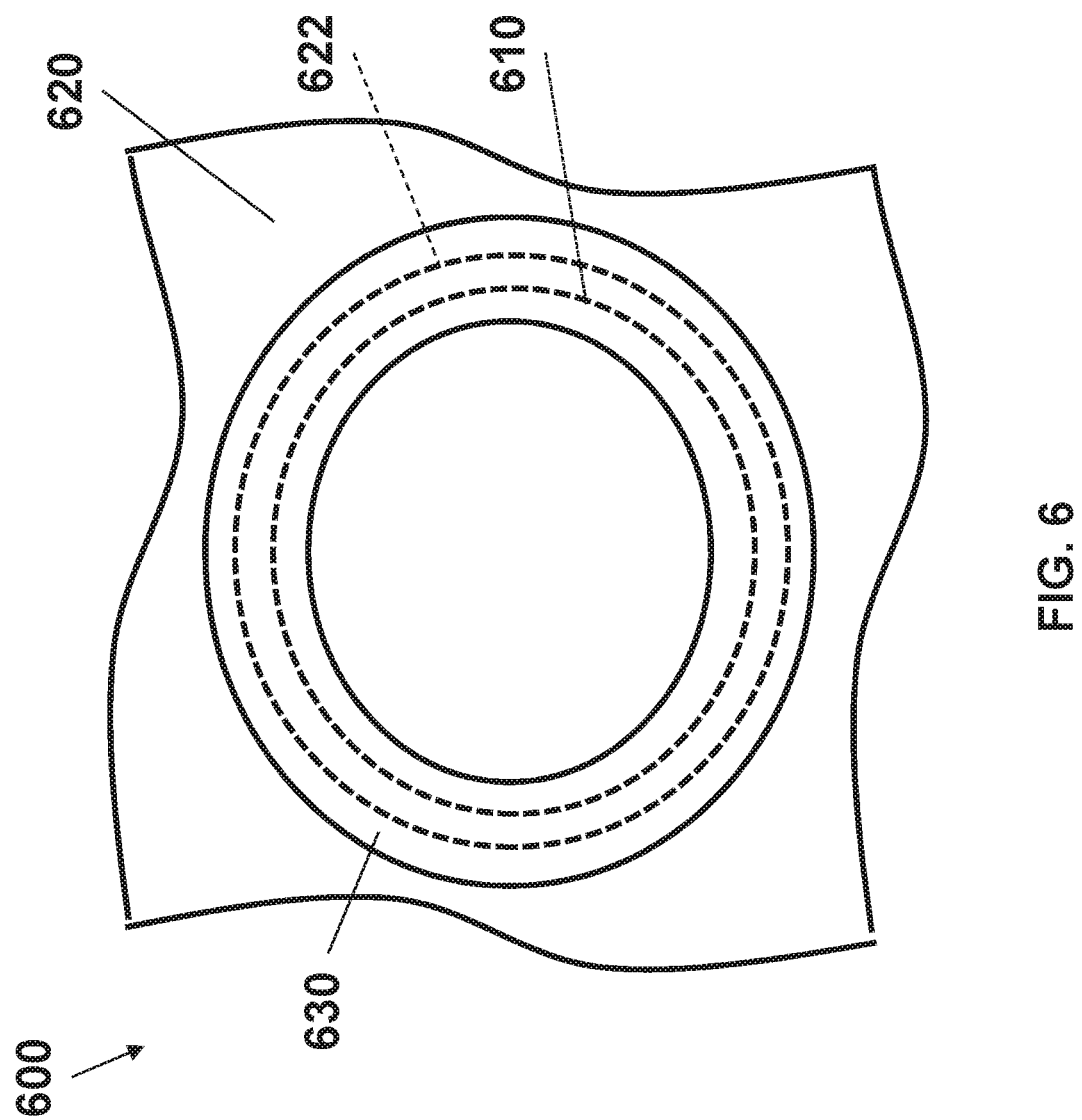
FIG. 6 is a partial plan view of a panel according to some embodiments of the present disclosure.

Referring to FIG. 6, a panel 600 that is similar to the panel 100 described above (FIG. 1) includes a component 610, a carrier strip 620, and a polymeric tab 630. The carrier strip 620 differs from the carrier strip 120 (FIG. 1) in that the carrier strip 620 includes an aperture 622 that surrounds the component 610. The aperture 622 defines a gap between the carrier strip 620 and the component 610. The polymeric tab 630 differs from the polymeric tab 130 (FIG. 1) in that the polymeric tab 630 has a generally annular shape and completely surrounds an outer edge of the component 610 and is coupled to an edge of the carrier strip 620 surrounding the aperture 622.

Advantageously, the polymeric tab 630 is stronger than the polymeric tab 130 described above because the polymeric tab 630 completely surrounds the outer edge of the component 610. Further, applying a peel force (e.g., using the same or similar method as described above in reference to FIGS. 3A-3C) to the polymeric tab 630 causes the entire polymeric tab 630 to be removed from the component 610 with no remaining portions or artifacts. While the carrier strip 620 is shown as a single element, alternatively the carrier strip 620 can comprise a plurality of separate portions. Further, while the component 610 is shown as having a generally circular shape, other shapes and sizes are possible (e.g., rectangular, polygonal, etc.)

Figure 7:
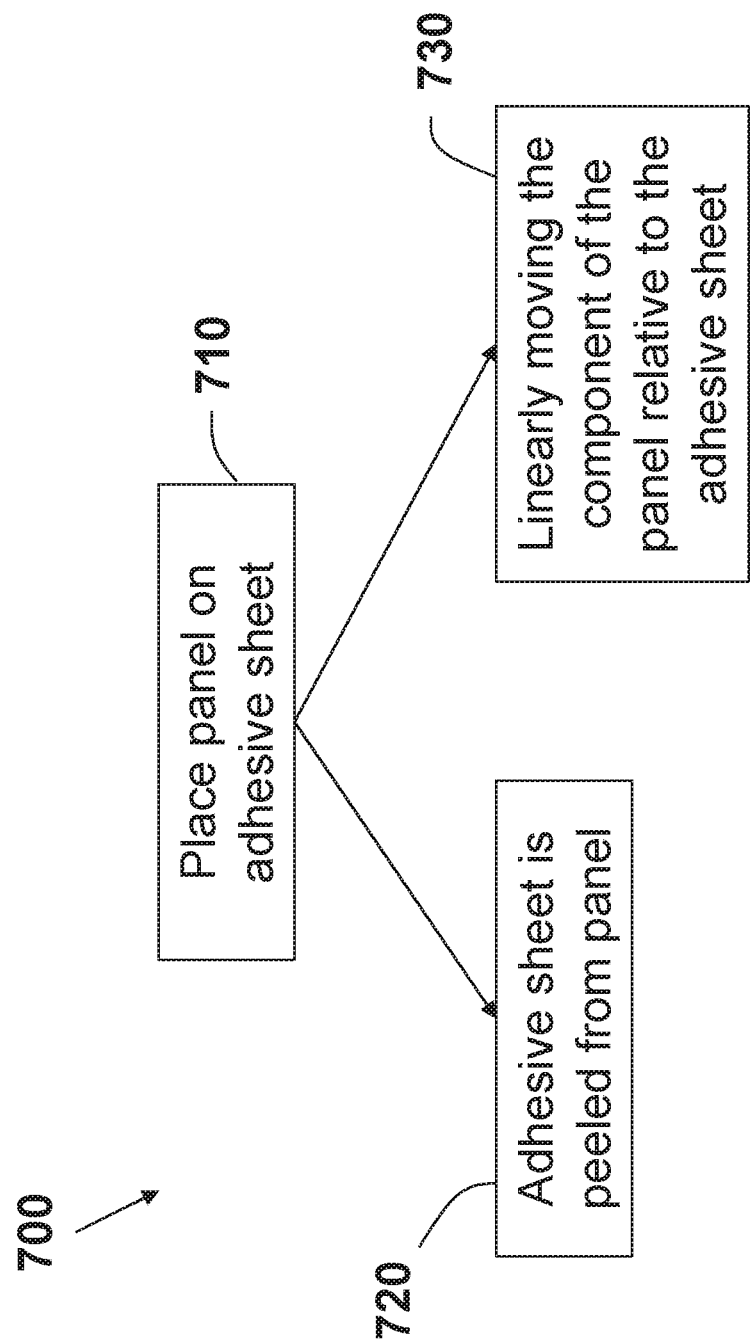
FIG. 7 is a schematic flow diagram for a method of removing a component from a panel according to some embodiments of the present disclosure.

Referring to FIG. 7, a method 700 for separating the component, such as embodiments described herein, from a panel includes a first step 710, a second step 720, and a third step 730. The first step 710 includes placing the panel on an adhesive sheet such that the adhesive sheet is coupled to a substrate of the component and to a polymeric tab, such as embodiments described herein. The adhesive sheet, for example, can be a wafer dicing tape or a lamination sheet.

An adhesive force between the polymeric tab and the adhesive sheet is greater than an adhesive force between the substrate of the component and the adhesive sheet. The difference in adhesive force aids in separating the polymeric tab from the component during the second step 720, where the adhesive sheet is peeled from the substrate of the component. Alternatively, rather than continuing from the first step 710 to the second step 720, the method 700 can include continuing from the first step 710 to the second step 720, which includes linearly moving, using an ejector pin that is the same as or similar to embodiments of the ejector pin (see e.g., FIGS. 3A-3C) described above, the component relative to the adhesive sheet.

While embodiments of the present invention have been described with reference to one or more particular embodiments, those skilled in the art will recognize that many changes may be made thereto without departing from the spirit and scope of the present invention. Each of these embodiments and obvious variations thereof is contemplated as falling within the spirit and scope of embodiments of the invention described herein. It is also contemplated that additional embodiments may combine any number of features from any of the embodiments described herein.

What is claimed is:

1. A panel comprising:
   a plurality of components;
   a plurality of carrier strips for supporting the components;
   a plurality of polymeric tabs, each of the plurality of polymeric tabs having a first portion coupled to an upper surface of one of the plurality of carrier strips and a second portion coupled to an upper surface of a substrate of a corresponding one of the plurality of components, each of the plurality of polymeric tabs configured to separate from the substrate of the one of the plurality of components responsive to application of a peeling force; and
   a plurality of metal tabs, each of the plurality of metal tabs corresponding to one of the plurality of polymeric tabs forming a pair of tabs,
   wherein each pair of tabs is coupled to the same carrier strip and component, and
   each of the plurality of metal tabs forms a unitary piece with one of the plurality of carrier strips and the corresponding one of the plurality of components.

2. The panel of claim 1, wherein each of the plurality tabs includes polyimide, epoxy, acrylic, or any combination thereof.

3. The panel of claim 1, wherein the substrate of each of the plurality of components includes metal, a polymer, ceramic, or any combination thereof.

4. The panel of claim 1, wherein the second portion of each of the plurality of polymeric tabs is coupled to a treated surface of the substrate of the component, the treated surface configured to aid in the separating of the second portion from the substrate of the corresponding one of the plurality of components.

5. The panel of claim 1, wherein the treated surface is a chemically roughened surface, a mechanically roughened surface, a mechanically polished surface, an oxidized surface, a laser polished surface, coating, or any combination thereof.

6. The panel of claim 1, wherein the treated surface provides a desired surface energy of the substrate of the corresponding one of the plurality of components.

7. The panel of claim 1, wherein each of the plurality of polymeric tabs includes a plurality of perforations configured to aid in separating the second portion of each of the plurality of polymeric tabs from the substrate of the corresponding one of the plurality of components.

8. The panel of claim 1, wherein the second portion of the polymeric tab includes a plurality of fingers configured to aid in separating the second portion of the polymeric tab from the substrate of the corresponding one of the plurality of components.

9. The panel of claim 1, wherein each of the plurality of polymeric tabs includes a metalized layer.

10. The panel of claim 9, wherein the metalized layer includes copper, nickel, gold, or any combination.

11. The panel of claim 1, wherein the second portion of each of the plurality of polymeric tabs is coupled to the substrate of the corresponding one of the plurality of components such that the second portion of the polymeric tab extends a first distance from an edge of the substrate of the component.

12. The panel of claim 11, wherein the first distance is between about 5 microns and about 200 microns.

13. The panel of claim 1, wherein an edge of the one of the plurality of carrier strips is spaced from an opposing edge of the one of the plurality of components by a distance.

14. The panel of claim 13, wherein the distance is between about 5 microns and about 300 microns.

* * * * *